United States Patent
Watanabe et al.

(10) Patent No.: US 10,920,138 B2
(45) Date of Patent: Feb. 16, 2021

(54) RED PHOSPHOR AND LIGHT EMITTING DEVICE

(71) Applicant: DENKA COMPANY LIMITED, Tokyo (JP)

(72) Inventors: Shintaro Watanabe, Fukuoka (JP); Yusuke Takeda, Fukuoka (JP)

(73) Assignee: DENKA COMPANY LIMITED, Tokyo (JP)

( * ) Notice: Subject to any disclaimer, the term of this patent is extended or adjusted under 35 U.S.C. 154(b) by 215 days.

(21) Appl. No.: 15/391,828

(22) Filed: Dec. 27, 2016

(65) Prior Publication Data
US 2017/0204327 A1 Jul. 20, 2017

(30) Foreign Application Priority Data
Jan. 15, 2016 (JP) .............................. JP2016-006594

(51) Int. Cl.
*H01L 33/00* (2010.01)
*C09K 11/77* (2006.01)
*H01L 33/50* (2010.01)

(52) U.S. Cl.
CPC ........ *C09K 11/7734* (2013.01); *H01L 33/502* (2013.01)

(58) Field of Classification Search
CPC .......... H01L 33/50–33/508; H01L 2933/0058; H01L 2933/0041; C09K 11/7734; C09K 11/7728; C09K 11/7766; C09K 11/7776
USPC .......................................................... 257/98
See application file for complete search history.

(56) References Cited

U.S. PATENT DOCUMENTS

| | | | |
|---|---|---|---|
| 2010/0090585 A1* | 4/2010 | Seto | C04B 35/16 313/503 |
| 2013/0334957 A1* | 12/2013 | Beckers | C03C 14/004 313/503 |
| 2015/0275082 A1 | 10/2015 | Hirosaki et al. | |
| 2016/0244664 A1* | 8/2016 | Tucks | C09K 11/0883 |
| 2017/0015902 A1* | 1/2017 | Weiler | C09K 11/655 |
| 2017/0125722 A1* | 5/2017 | Wehlus | H01L 51/5212 |

FOREIGN PATENT DOCUMENTS

| | | |
|---|---|---|
| JP | 2004071726 A | 3/2004 |
| WO | 2005052087 A1 | 6/2005 |

OTHER PUBLICATIONS

English language abstract for JP 2004071726 A (2004).
English language abstract for WO 2005052087 A1 (2005).

* cited by examiner

*Primary Examiner* — Kevin M Picardat
(74) *Attorney, Agent, or Firm* — Caesar Rivise, PC

(57) ABSTRACT

An object of the present invention is to provide a red phosphor having improved luminance. A further object of the present invention is to provide a light emitting device having higher luminance by using the red phosphor. There is provided a phosphor having the main crystal phase represented by the general formula: $MAlSiN_3$ in which the M element(s) represent one or more elements selected from the group consisting of Mg, Ca, Sr, and Ba, the main crystal phase being composed of only $CaAlSiN_3$ or having the same crystal structure as that of $CaAlSiN_3$, and some of the M element(s) being substituted with an Eu element, wherein the phosphor contains W (tungsten) in an amount of 3 ppm or more and 500 ppm or less, based on the total mass of the phosphor.

6 Claims, No Drawings

RED PHOSPHOR AND LIGHT EMITTING DEVICE

This application claims priority under 35 U.S.C. § 119 to Japanese Patent Application No. 2016-006594 filed Jan. 15, 2016, which is hereby incorporated by reference in its entirety.

TECHNICAL FIELD

The present invention relates to a red phosphor for LEDs (Light Emitting Diodes) or LDs (Laser Diodes), and a light emitting device using the red phosphor. More particularly, the present invention relates to a red phosphor having high luminance and a light emitting device having improved luminance by using the red phosphor.

BACKGROUND ART

A white LED is a device that emits quasi-white light by the combination of semiconductor light emitting elements with phosphors, and as a representative example, the combination of blue LEDs and YAG yellow phosphors is known. However, the kind of white LED causes problems that, although the chromaticity coordinate value of the emitted light is within the white color region, the light lacks a red luminescent component, thereby resulting in a lower color rendering property for lighting application and a poor color reproducibility in image display devices such as a liquid crystal backlight. In view of the issues, to compensate for the lacking red light emitting component, it has been proposed to use together with the YAG phosphor a nitride or an oxynitride phosphor which emits red light (see Patent Document 1).

As nitride phosphors emitting red light, those which are activated with an optically active element and have, as a host crystal, an inorganic compound possessing the same crystal structure as that of a $CaAlSiN_3$ crystal phase are known in the art. $CaAlSiN_3$-based phosphors activated with $Eu^{2+}$ are particularly known to emit light with particularly high luminance (see Patent Document 2). Patent Document 2 also discloses that substituting a part of Ca with Sr provides a phosphor having an emission peak wavelength shifted to a shorter wavelength side. The $(Sr,Ca)AlSiN_3$-based phosphor activated with $Eu^{2+}$ is known to be effective as a red phosphor for high luminance white LEDs because the phosphor has a shorter emission wavelength than that of the $CaAlSiN_3$-based nitride phosphor and has increased spectral components in a region with high visibility.

However, the $CaAlSiN_3$-based nitride phosphor has increased spectral components with low visibility, so that the luminance of a white LED is reduced, although the phosphor can achieve a higher color rendering property because the emitted light contains more spectral components in the deep red region.

CITATION LIST

Patent Literature

Patent Document 1: Japanese Patent Application Laid-open Publication No. 2004-071726A Patent Document 2: WO 2005/052087

SUMMARY OF INVENTION

Technical Problem

In view of the issues above, there has been requirements in the art phosphors emitting light with higher luminance to provide light emitting devices having higher luminance.

Solution to Problem

An object of the present invention is to provide a red phosphor having improved luminance. A further object of the present invention is to provide a light emitting device having higher luminance by using the red phosphor.

As a result of extensive studies to solve the problems as stated above, the present inventors have found that in an Eu-activated phosphor having the main crystal phase composed only of a $CaAlSiN_3$ crystal phase or an Eu-activated phosphor having the same crystal structure as that of the $CaAlSiN_3$ crystal phase, control of the amount of W (tungsten) in the phosphor has provided a red phosphor having improved luminance, and completed the present invention.

Thus, embodiments of the present invention will provide the following aspects:

Aspect (1): A phosphor having a main crystal phase represented by the general formula: $MAlSiN_3$ in which the M element(s) represent one or more elements selected from the group consisting of Mg, Ca, Sr, and Ba, the main crystal phase being composed of only $CaAlSiN_3$ or having the same crystal structure as that of $CaAlSiN_3$, and some of the M element(s) being substituted with Eu element, wherein the phosphor contains W (tungsten) in an amount of 3 ppm or more and 500 ppm or less, based on the total mass of the phosphor.

Aspect (2): The phosphor according to Aspect (1), wherein the phosphor contains tungsten in an amount of 5 ppm or more and 362 ppm or less, based on the total mass of the phosphor.

Aspect (3): The phosphor according to Aspect (1) or (2), wherein the M element is Ca.

Aspect (4): The phosphor according to Aspect (1) or (2), wherein the M elements are Ca and Sr.

Aspect (5): The phosphor according to Aspect (4), wherein the value of Sr/(Ca+Sr) when expressed in moles is 0.75 or more and 0.97 or less.

Aspect (6): A light emitting device comprising the phosphor according to any one of Aspects (1) to (5) and a light emitting element.

Advantageous Effects of Invention

According to an embodiment of the present invention, a $CaAlSiN_3$-based nitride phosphor with higher luminance can be provided, and a light emitting element with higher luminance can be provided by combining the phosphor with a light emitting source such as LEDs. A further embodiment of the present invention can also provide a light emitting device comprising a light emitting element and an apparatus for housing the light emitting element. Examples of the light-emitting device include lighting devices, backlight devices, image display devices, and signal devices.

DESCRIPTION OF EMBODIMENTS

Hereinafter, embodiments for carrying out the present invention will be described in detail. It should be noted that in this specification, a numerical range includes the lower and upper limit values unless otherwise defined.

For the sake of convenience, the present specification states that the composition of the main crystalline phase in the phosphor is represented by the general formula $MAlSiN_3$. However, even if raw materials are formulated so as to obtain the phosphor having such composition, the composition may slightly vary after firing. The compositions of the phosphors disclosed in the present specification encompass such variations. Further, the main crystal phase of the present phosphor is composed of only a $CaAlSiN_3$ crystal phase or has the same structure as that of the $CaAlSiN_3$ crystal phase. Whether or not the main crystal phase of the phosphor has the same structure as that of the $CaAlSiN_3$ crystal can be confirmed by a powder X-ray diffraction analysis. Any crystal structure different from $CaAlSiN_3$ is not preferred because the luminescent color may not be red or the fluorescence intensity may be greatly decreased. The crystal phase may preferably be a single phase of the crystal but may comprise heterogeneous phases as long as they do not significantly affect properties of the phosphor. The presence or absence of the heterogeneous phase can be determined by observing the presence or absence of a peak other than that of the target crystalline phase, for example, by a powder X-ray diffraction analysis.

The skeleton structure of the $CaAlSiN_3$ crystal is formed by binding of $(Si,Al)-N_4$ tetrahedrons in which the Ca atoms are located in gaps present in the skeleton. A part of $Ca^{2+}$ is substituted with $Eu^{2+}$ which will act as a luminescent center, thereby resulting in a red phosphor.

The composition of the present phosphor is represented by the general formula $MAlSiN_3$, in which the M element(s) is/are one or more selected from Mg, Ca, Sr, and Ba. In certain embodiments, the M element(s) may preferably comprise Ca and Sr. More preferably, the present phosphor may be a so-called CASN phosphor or SCASN phosphor, in which the M element(s) is Ca alone or are two elements of Ca and Sr where the value of Sr/(Ca+Sr) is 0.75 or more and 0.97 or less (the ratio of mole numbers).

If the content of Eu which is the activating element for the phosphor is too little, any contribution to the emission of light will tend to be small. If the amount of Eu is too much, concentration quenching of the phosphor will tend to occur due to energy transfer between $Eu^{2+}$ ions. In an embodiment of the present invention, the content of Eu in the phosphor is 0.01 at % or more and 0.3 at % or less, and preferably 0.04 at % or more and 0.2 at % or less, and more preferably 0.06 at % or more and 1.5 at % or less, based on the total mass of the phosphor.

In addition, the present phosphor contains a trace amount of oxygen (O) as an unavoidable component. So, a choice of the M element(s), Si/Al ratio, N/O ratio and the like may be adjusted such that electric neutrality is maintained over the whole phosphor while maintaining the crystal structure.

The present phosphor contains W (tungsten) of 3 ppm or more and 500 ppm or less. When the amount of tungsten is less than 3 ppm or more than 500 ppm, the luminance will tend to decrease. In an embodiment of the present invention, the tungsten content may preferably be 5 ppm or more and 362 ppm or less.

In one embodiment of the present invention, tungsten in the present phosphor may be added as an oxygen-containing tungsten compound, a nitrogen-containing tungsten compound, or a metal tungsten as a raw material, or may be inherently contained in other raw materials. Alternatively, the tungsten may be tungsten inevitably mixed in the present phosphor from a furnace, a container, an atmosphere, or the like.

The present phosphor may be manufactured by any producing method similar to that of the conventional $CaAlSiN_3$-based phosphor. As one embodiment of the present invention, a method of firing the blended raw material powders that can make up the composition represented by the above general formula in a nitrogen atmosphere in a predetermined temperature range will be illustrated herein by way of example.

In the producing method, nitrides of the constituent elements, namely, calcium nitride, silicon nitride, aluminum nitride and europium nitride may preferably be used as raw materials, but oxides may also be used. For example, europium oxide which is easily available may be used as a europium source that may be in a minor addition amount since europium acts as a luminescent center.

A method of blending the raw materials as stated above is not particularly limited, but calcium nitride, strontium nitride, or europium nitride which will vigorously react with moisture and oxygen in the air should be suitably handled in an inert atmosphere-substituted glove box.

A firing vessel may preferably be made of a material that is stable in a nitrogen atmosphere at an elevated temperature and is not susceptible to reaction with the blended raw material powders and the reaction product. The firing vessel may include vessels made of boron nitride or carbon, and the like.

The firing vessel filled with the blended raw material powders is taken out from the glove box, set in a firing furnace promptly, and fired at 1600° C. or more and 1900° C. or less in a nitrogen atmosphere. If the firing temperature is too low, the amount of unreacted substance remained will increase, and if the firing temperature is too high, the main crystalline phase will decompose, which are not preferable.

A firing time is selected in a time range such that inconvenience such as a lot of unreacted substances present, insufficient grain growth or a decrease in productivity does not occur. In a preferred embodiment of the present invention, the firing time may be 2 hours or more and 24 hours or less.

The pressure of the firing atmosphere is selected depending on the firing temperature. The present phosphor can stably exist under atmospheric pressure at a temperature up to about 1800° C. (degrees C.). At a higher temperature, the present phosphor should be placed in a pressurized atmosphere in order to suppress decomposition of the phosphor. The higher the ambient pressure, the higher the decomposition temperature of the phosphor, but considering industrial productivity, the pressure may preferably be less than 1 MPa.

The fired product may be present in various forms, e.g. in the form of powder, aggregates, and a sintered body, depending on the blended raw materials and firing conditions. For use as the phosphor, the fired product is formed into the powder with a predetermined size by combining disintegration, pulverization and/or classification operations. When suitably used as the phosphor for LEDs, the average particle size of the fired product is preferably adjusted. The average particle size may be from 5 μm to 30 μm (microns).

For the production of the phosphor, you may further carry out an acid treatment step for the purpose of removing impurities and an annealing treatment step for the purpose of improving the crystallinity.

The present phosphor can be used for a light emitting device comprising a light emitting source and the phosphor.

In particular, when a light emitting source emitting ultraviolet light or visible light containing a wavelength from 350 nm to 500 nm is used as an excitation source to irradiate the phosphor. The phosphor emits red light having a fluorescence peak around 610 nm to 650 nm. Therefore, the present embodiment can easily obtain white light by combining the present phosphor with a light emitting source such as an ultraviolet LED or a blue LED, and optionally a green to yellow phosphor and/or a blue phosphor.

EXAMPLES

Examples of the present invention will be described in detail with reference to Tables 1 and 2 below. Table 1 shows amounts of tungsten, molar ratios of Sr and Ca and luminescence properties for the phosphors in Examples and Comparative Examples when Sr and Ca are used together as the M elements. Table 2 shows amounts of tungsten and luminescence properties for the phosphors in an Example and Comparative Examples when Ca was used alone as the M element.

TABLE 1

|  | W Content (ppm) | | Mol Ratio of Sr and Ca Sr/(Sr + Ca) | Peak Wavelength (nm) | Emission Peak Intensity (%) |
| --- | --- | --- | --- | --- | --- |
|  | In Raw Materials | After Firing | | | |
| Example 1 | 30 | 5 | 0.90 | 620 | 100 |
| Example 2 | 50 | 10 | 0.90 | 620 | 102 |
| Example 3 | 400 | 95 | 0.90 | 620 | 104 |
| Example 4 | 600 | 193 | 0.90 | 620 | 107 |
| Example 5 | 1000 | 362 | 0.90 | 620 | 101 |
| Example 6 | 400 | 103 | 0.70 | 635 | 98 |
| Example 7 | 400 | 94 | 0.80 | 630 | 102 |
| Example 8 | 400 | 97 | 0.94 | 616 | 106 |
| Comparative Example 1 | 10 | 1 | 0.90 | 620 | 92 |
| Comparative Example 2 | 1500 | 708 | 0.90 | 620 | 83 |

TABLE 2

|  | W Content (ppm) | | Peak Wavelength (nm) | Emission Peak Intensity (%) |
| --- | --- | --- | --- | --- |
|  | In Raw Materials | After Firing | | |
| Example 9 | 400 | 98 | 645 | 100 |
| Comparative Example 3 | 10 | 2 | 645 | 92 |
| Comparative Example 4 | 1500 | 682 | 645 | 88 |

Example 1

As raw materials for the phosphor in Example 1, alpha-type silicon nitride powder ($Si_3N_4$, SN-E10 grade, available from UBE INDUSTRIES, LTD.), calcium nitride powder ($Ca_3N_2$, available from Materion Corporation), strontium nitride powder ($Sr_3N_2$, purity of 2 N, available from Kojundo Chemical Lab. Co., Ltd.), aluminum nitride powder (AlN, E grade, available from Tokuyama Corporation), and europium oxide ($Eu_2O_3$, RU grade, available from Shin-Etsu Chemical Co., Ltd.) were used at the ratio of Sr:Ca:Al:Si=0.90:0.10:1.00:1.00. Tungsten trioxide powder ($WO_3$, purity of 3 N, available from Kojundo Chemical Lab. Co., Ltd.) was also added at 30 ppm.

First, among the raw materials, $Si_3N_4$, AlN, $Eu_2O_3$, and $WO_3$ were subjected to dry blending for 10 minutes using a V-type mixer. In order to make the sizes of the blended raw materials uniform, the blended raw materials were classified through a nylon sieve having openings of 250 μm to provide a raw material mixture.

The raw material mixture passed through the sieve was placed in a glove box capable of holding a nitrogen atmosphere containing a moisture content of 1 ppm by mass or less and oxygen of 1 ppm by mass or less. $Ca_3N_2$ and $Sr_3N_2$ were blended into the raw material mixture and subjected to dry blending in the glove box. In order to make the sizes of the dry blended raw materials uniform, classification was carried out again through the nylon sieve having the openings of 250 μm. The classified raw materials were filled in the amount of 300 grams into a cylindrical-shaped boron nitride container with a lid (N-1 grade, available from Denka Company Limited.).

The container filled with the raw materials was taken out from the glove box, immediately set in an electric furnace with carbon heaters. The furnace was sufficiently evacuated under vacuum to 0.1 Pa or less. In a state where the evacuation under vacuum was maintained, heating was started, nitrogen gas was introduced at 600° C., and a pressure of the atmosphere in the furnace was set to 0.8 MPa. After the introduction of the gas, the temperature was raised to 1800° C. while maintaining the evacuation under vacuum and firing was carried out at 1800° C. for 4 hours.

After cooling, a sample was collected from the furnace. The sample was red agglomerate. The sample was disintegrated in a mortar to pass through a sieve having openings of 45 μm.

The resulting phosphor sample was subjected to a powder X-ray diffraction analysis using an X-ray diffractometer (Ultima IV, available from Rigaku Corporation) with CuKα wavelength. The resulting X-ray diffraction pattern showed the same diffraction pattern as that of the $CaAlSiN_3$ crystal, confirming that the main crystal phase had the same crystal structure as that of the $CaAlSiN_3$ crystal.

The amounts of Ca, Sr, Si, and W were analyzed by an ICP emission spectroscopic analyzer (CIROS-120, available from Rigaku Corporation) after dissolving the powder by a pressurized acid decomposition method. The ratio of Sr/(Ca+Sr) in the powder was 0.90, and the W content was 5 ppm.

Fluorescence measurement was performed using a spectral fluorescence photometer (F-7000, available from Hitachi High-Technologies Corporation) which was corrected by Rhodamine B and a secondary standard light source. Using a solid sample holder attached to the photometer for the measurement, a fluorescence spectrum at an excitation wavelength of 455 nm was obtained. A peak wavelength of the fluorescence spectrum was 620 nm.

A light emission peak intensity (relative luminance) was calculated from the product of the fluorescence spectrum intensity and the standard CIE spectral luminous efficiency. The following Examples and Comparative Examples are measured by using exactly the same sampling methods and conditions as in Example 1, and are shown as relative values when assuming Example 1 to be 100%. 95% or more is determined as improved luminance.

Examples 2 to 8 and Comparative Examples 1 and 2

Phosphor powders in Examples 2 to 8 and Comparative Examples 1 and 2 were prepared using the same raw material powders and under the same conditions as in Example 1, with the exception that the amount of $WO_3$ and the ratio of Sr/(Ca+Sr) were changed to those shown in Table 1. Luminescent properties of the phosphors obtained in Examples 2 to 8 and Comparative Examples 1 and 2 are shown in Table 1 together with the results of Example 1.

Example 9

As raw materials for the phosphor in Example 9, alpha-type silicon nitride powder ($Si_3N_4$, SN-E10 grade, available from UBE INDUSTRIES, LTD.), calcium nitride powder ($Ca_3N_2$, available from Materion Corporation), aluminum nitride powder (AlN, E grade, available from Tokuyama Corporation), and europium oxide (Eu2O3, RU grade, available from Shin-Etsu Chemical Co., Ltd.) were used at the ratio of Ca:Al:Si =1.00:1.00:1.00. Tungsten trioxide powder ($WO_3$, purity of 3 N, available from Kojundo Chemical Lab. Co., Ltd.) was also added at 400 ppm.

First, among the raw materials, $Si_3N_4$, AlN, Eu2O3, and $WO_3$ were subjected to dry blending for 10 minutes using a V-type mixer. In order to make the sizes of the blended raw materials uniform, the blended raw materials were classified through a nylon sieve having openings of 250 μm to provide a raw material mixture.

The raw material mixture passed through the sieve was displaced in a glove box capable of holding a nitrogen atmosphere containing a moisture content of 1 ppm by mass or less and oxygen of 1 ppm by mass or less. $Ca_3N_2$ was blended into the raw material mixture and subjected to dry blending in the glove box. In order to make the sizes of the dry blended raw materials uniform, classification was carried out again through the nylon sieve having the openings of 250 μm. The classified raw materials were filled in the amount of 300 grams into a cylindrical-shaped boron nitride container with a lid (N-1 grade, available from Denka Company Limited.).

The container filled with the raw materials was taken out from the glove box, immediately set in an electric furnace with carbon heaters. The furnace was sufficiently evacuated under vacuum to 0.1 Pa or less. In a state where the evacuation under vacuum was maintained, heating was started, nitrogen gas was introduced at 600° C., and a pressure of the atmosphere in the furnace was set to 0.8 MPa. After the introduction of the gas, the temperature was raised to 1800° C. while maintaining the evacuation under vacuum, and firing was carried out at 1800° C. for 4 hours.

After cooling, a sample collected from the furnace was red agglomerate. The sample was disintegrated in a mortar to pass through a sieve having openings of 45 μm.

The resulting phosphor sample was subjected to a powder X-ray diffraction analysis using an X-ray diffractometer (Ultima IV, available from Rigaku Corporation) with CuKα wavelength. The resulting X-ray diffraction pattern showed the same diffraction pattern as that of the $CaAlSiN_3$ crystal.

The amounts of Ca, Si, and W were analyzed by an ICP emission spectroscopic analyzer (CIROS-120, available from Rigaku Corporation) after dissolving the powder by a pressurized acid decomposition method, and as a result, the W content was 98 ppm.

Fluorescence measurement was performed using a spectral fluorescence photometer (F-7000, available from Hitachi High-Technologies Corporation) which was corrected by Rhodamine B and a secondary standard light source. Using a solid-sample holder attached to the photometer for the measurement, a fluorescence spectrum at the excitation wavelength of 455 nm was obtained. The peak wavelength of the fluorescence spectrum was 645 nm.

A light emission peak intensity (relative luminance) was calculated from the product of the fluorescence spectrum intensity and the standard CIE spectral luminous efficiency. The following Comparative Examples are measured by using exactly the same sampling methods and conditions as in Example 9, and are shown as relative values when assuming Example 9 to be 100%. The value of 95% or more is determined as improved luminance.

Comparative Examples 3 and 4

Phosphor powders in Comparative Examples 3 and 4 were prepared using the same raw material powders and under the same conditions as in Example 9, with the exception that each amount of $WO_3$ was changed to that shown in Table 2. Luminescent properties of the phosphors obtained in Comparative Examples 3 and 4 are shown in Table 2 together with the results of Example 9.

As shown in Tables 1 and 2, the luminance was improved by controlling the tungsten content in the phosphor to the specific range.

The present invention has been described based on Examples. It will be understood by one of ordinary skill in the art that the Examples are merely illustrative, and various modifications are possible, and that such modifications will be also within the scope of the present invention.

INDUSTRIAL APPLICABILITY

The CaAlSiN-based phosphor of the present invention is excited by blue light and exhibits red light emission with higher luminance. Therefore, the present phosphor can be suitably used as a phosphor for white LEDs using blue light as a light source, and the present phosphor can be suitably used for a light emitting device such as lighting devices and image display devices.

The invention claimed is:

1. A phosphor having a main crystal phase represented by the general formula: $MAlSiN_3$ in which the M element(s) represent one or more elements selected from the group consisting of Mg, Ca, Sr, and Ba, the main crystal phase being composed of only $CaAlSiN_3$ or having the same crystal structure as that of $CaAlSiN_3$, and some of the M element(s) being substituted with an Eu element, wherein the phosphor contains W (tungsten) in an amount of 3 ppm or more and 500 ppm or less, based on the total mass of the phosphor.

2. The phosphor according to claim 1, wherein the phosphor contains W in an amount of 5 ppm or more and 362 ppm or less, based on the total mass of the phosphor.

3. The phosphor according to claim 1, wherein the M element is Ca.

4. The phosphor according to claim 1, wherein the M elements are Ca and Sr.

5. The phosphor according to claim 4, wherein the value of Sr/(Ca+Sr) when expressed in moles is 0.75 or more and 0.97 or less.

6. A light emitting device comprising the phosphor according to claim 1 and a light emitting element.

* * * * *

UNITED STATES PATENT AND TRADEMARK OFFICE
CERTIFICATE OF CORRECTION

Page 1 of 1

PATENT NO. : 10,920,138 B2
APPLICATION NO. : 15/391828
DATED : February 16, 2021
INVENTOR(S) : Watanabe et al.

It is certified that error appears in the above-identified patent and that said Letters Patent is hereby corrected as shown below:

In the Claims

Column 8 (Lines 49-50) In Claim 1, Lines 8 and 9 the wording "in an amount of 3 ppm or more and 500 ppm or less" should read --in an amount of 5 ppm or more and 362 ppm or less--.

Signed and Sealed this
Fifteenth Day of June, 2021

Drew Hirshfeld
*Performing the Functions and Duties of the*
*Under Secretary of Commerce for Intellectual Property and*
*Director of the United States Patent and Trademark Office*